United States Patent [19]

Foyt et al.

[11] Patent Number: 4,525,871
[45] Date of Patent: Jun. 25, 1985

[54] HIGH SPEED OPTOELECTRONIC MIXER

[75] Inventors: Arthur G. Foyt; Frederick J. Leonberger, both of Lexington; Richard C. Williamson, Sudbury, all of Mass.

[73] Assignee: Massachusetts Institute of Technology, Cambridge, Mass.

[21] Appl. No.: 345,228

[22] Filed: Feb. 3, 1982

[51] Int. Cl.³ .............................................. H04B 1/26
[52] U.S. Cl. .................................. 455/325; 250/211 J
[58] Field of Search ................ 455/323, 325, 619; 307/424, 425; 200/61.02; 330/4.5; 332/7.51, 2; 250/211 J; 357/30

[56] References Cited

U.S. PATENT DOCUMENTS

| | | | |
|---|---|---|---|
| 3,530,298 | 9/1970 | Hubbard et al. | 455/619 |
| 3,716,804 | 2/1973 | Groschwitz | 332/7.51 |
| 3,917,943 | 11/1975 | Auston | 357/30 |
| 3,923,380 | 12/1975 | Hattori et al. | 350/160 R |
| 3,942,132 | 3/1976 | Zinn | 331/94.5 H |
| 3,949,224 | 4/1976 | Klingen | 332/7.51 |
| 3,958,862 | 5/1976 | Scibor-Rylski | 350/160 R |
| 3,962,657 | 6/1976 | Redman et al. | 332/7.51 |
| 4,020,341 | 4/1977 | Javan | 250/211 J |
| 4,218,618 | 8/1980 | Mourov | 250/211 J |
| 4,291,323 | 9/1981 | Bachmann | 357/30 |
| 4,293,956 | 10/1981 | Alstatt | 455/327 |
| 4,301,362 | 11/1981 | Mourou | 250/211 J |
| 4,376,285 | 3/1983 | Leonberger et al. | 357/17 |
| 4,396,833 | 8/1983 | Pan | 250/211 J |

OTHER PUBLICATIONS

Baird et al.–GaAs Infrared Source for Optoelectronic Applications–1963 International Solid–State Ckts Conf.–pp. 108, 109.

Foyt et al.–"Isolation of Junction Devices"–Solid State Electronics, Pergamon Press, 1969, vol. 12, pp. 209–214.

Leonberger–High Speed InP Optoelectronic Switch–Appl. Phy. Lett. 35(9)–Nov. 1, 1979, pp. 712–714.

Primary Examiner—Joseph A. Orsino, Jr.
Attorney, Agent, or Firm—Arthur A. Smith, Jr.; Leo R. Reynolds

[57] ABSTRACT

An electronic mixer is decribed which utilizes an optoelectronic switch formed from a semi-insulating substrate of indium phosphide doped with a deep level impurity and disposed intermediate a microstrip transmission line. One conductor of the transmission line has a small gap in its metallization. Upon illumination of the gap by laser pulses from a laser source which are absorbed near the semiconductor surface, a photogenerated electron-hole plasma forms thereby providing a conducting path across the gap. An RF signal to be mixed with a LO signal is coupled to one side of the switch. The LO signal controls the Laser source. The output of the switch is therefore the product of the RF and LO signal.

3 Claims, 7 Drawing Figures

HIGH SPEED OPTOELECTRONIC MIXER

GOVERNMENT SUPPORT

Work described herein was supported by the U.S. Air Force and the U.S. Army under respective contracts F19628-80-C-0002 and F19628-79-C-0002.

DESCRIPTION

1. Technical Field

This invention is in the field of solid state optoelectronic devices.

2. Background Art

A need exists for high performance electronic mixers and modulators. In the electronics arts, a mixer is a device that multiplies two electrical signals to produce a signal which is the product of the two signals and which contains sum and difference frequency components of the two signals. Since the early days of radio communication, mixers have been employed in superheterodyne receivers to produce an intermediate frequency (IF) signal representing the amplitude modulated (AM) radio frequency (RF) signal, frequency translated to an intermediate frequency by mixing the RF signal with a local oscillator (LO) signal and passing the difference product through a filter stage which filters out the sum signal. In this fashion, all AM receivers could be designed to detect and amplify at the IF frequency without regard to the frequency of the RF signal.

The design of mixers has advanced from simple diode switching circuits to solid state field effect transistor (FET) mixer circuits to Bipolar Transistor Mixers (*Communication Circuits: Analysis and Design* Clark and Hess, 1971, Addison-Wesley Publishing Co., Inc. p. 293-297).

A special form of a mixer is a chooper modulator. In simplified terms, a chopper modulator utilizes a switch signal s(t) to modulate an input signal $v_1(t)$ to yield an output signal $v_2(t)$. When the switch is closed, $v_1(t) = v_2(t)$ and when the switch is open $v_2(t) = 0$. Thus, $v_1(t)$ is multiplied by, or mixed with, s(t).

In prior art mixers it is difficult to isolate the switching signal s(t) (or LO signal) from the output signal $v_2(t)$ (or IF signal); thus, the LO signal may "leak" to the output port causing undesirable interference. Also, diodes or diode bridge mixers are inherently non-linear elements, hence they can generate and mix harmonics of both the LO signal and RF signal. These harmonics are spurious undesirable signals which can limit the bandwidth and sensitivity of systems using current state-of-the art mixers.

DISCLOSURE OF THE INVENTION

In co-pending U.S. patent application Ser. No. 162,073 filed June 23, 1980, now U.S. Pat. No. 4,376,285, there is shown a high speed optoelectronic indium phosphide (InP) switch. The switch is fabricated from an indium phosphide wafer which is made semi-insulating by introduction of a deep level impurity such as an iron (Fe) or chromium (Cr) dopant. The indium phosphide semi-insulating substrate serves as the dielectric in a microstrip transmission line. The top strip on the transmission line is a narrow striped metallic conductor which has a small gap located along the strip at about the mid-point of the strip. Optionally, on both sides of the gap, the metallization may be covered by a thin optically semi-transparent film for a short distance along the strip.

When the gap is illuminated by an intense laser pulse, photons are absorbed near the surface of the semi-insulating substrate and a photogenerated electron-hole plasma forms a conductive path across the gap, turning the switch "on".

We have found that this switch is particularly suitable for application as a mixer or chopper modulator.

In this application, the optoelectronic switch mixer provides essentially total isolation between the LO signal port and other mixer ports thus eliminating leakage of the LO signal to the output IF port. Also, there is no D.C. bias required for mixer operation, thereby simplifying the design and operation of the circuits.

Finally, there are no unwanted D.C. terms appearing in the mixer output, making it particularly attractive for synchronous demodulation applications.

The optoelectronic switch is also well suited for use as a bilinear mixer, in which the IF output is a linear product of the RF input and LO input. This mode of operation is made possible by the linear relation between mixer on-state conductance and incident light power level, and the linear relation between input current and light power level in some semiconductor diode lasers. Operation in the mode greatly suppresses unwanted harmonics and products, and therefore makes this bilinear mixer particularly attractive for crowded spectrum and large fractional bandwidth applications.

We have calculated the expected frequency performance of InP optoelectronic mixers operating in the switch mode. These calculations are tabulated in Table 1 below:

TABLE 1

Projected performance of impedance-method InP optoelectronic mixers

| | | | | |
|---|---|---|---|---|
| Photoconductive Lifetime (psec) | 1000 | 50 | 10 | 1 |
| Maximum Operating Frequency (GHz) | 0.16 | 3.2 | 16 | 160 |
| Minimum Feature Size 1 (μm) | 2 | 1 | 0.5 | 0.25 |
| Capacitance (fF) | 5 | 10 | 20 | 40 |
| On-State Resistance (ohms) for $\omega = 0.1\ \omega_c$ | 20 × 10³ | 500 | 50 | 2.5 |
| Required Laser Power (mW) | 0.0015 | 0.3 | 3.75 | 188 |

Device area = 20 × 20 μm²
Electron mobility = 4000 cm²/V-sec

A primary parameter is the photoconductive lifetime in InP. The first two columns cover the range of photoconductive lifetimes that have been observed to date, and the final two columns indicate what could be achieved if the lifetime could be further reduced. For each case, the maximum frequency is inversely proportional to the lifetime. The minimum feature sizes shown are representative of current state-of-the-art in the first two columns and of straight-forward development in the last two columns. For good switch and mixer performance in impedance matched operation, it is desirable that the device on-state resistance be less than one-tenth of the off-state impedance, or equivalently $\omega_c > 10\omega$. This criterion establishes the maximum on-state resistances and thus the minimum required laser powers. It is assumed that impedance matching can be employed to match the mixer to the surrounding circuitry. The power levels in the first three columns are well within the state-of-the-art of current diode lasers.

Inasmuch as the photoconductive lifetime is such a critical parameter in the device performance of InP optoelectronic mixers; we have attempted to increase the usable operating frequency of these mixers by reducing photoresponse time, i.e., photoconductive lifetime. This was accomplished, in accordance with the invention, by subjecting the switches to proton bombardment to reduce the lifetime after which the switches were annealed in hydrogen to improve the carrier mobility (which was reduced by the bombardment).

It was possible to achieve greatly reduced photo response time (from ~5 nsec to <100 psec) with only a moderate reduction in mobility (2000 $cm^2/V$ sec to 600 $cm^2/V$sec). This combination of short response time and high mobility in these photoconductive applications is a considerable advance over the current state-of-the-art.

Proton bombardment causes radiation damage to the crystalline structure of the dielectric InP substrate and in a manner not completely understood reduces the photoresponse time.

These and other applications and embodiments of the invention will be described in greater detail in connection with the drawings.

BRIEF DESCRIPTION OF THE DRAWINGS

FIG. 2d is a section taken along lines 2d-2d of FIG. 3);

BEST MODE OF CARRYING OUT THE INVENTION

Figure 1:
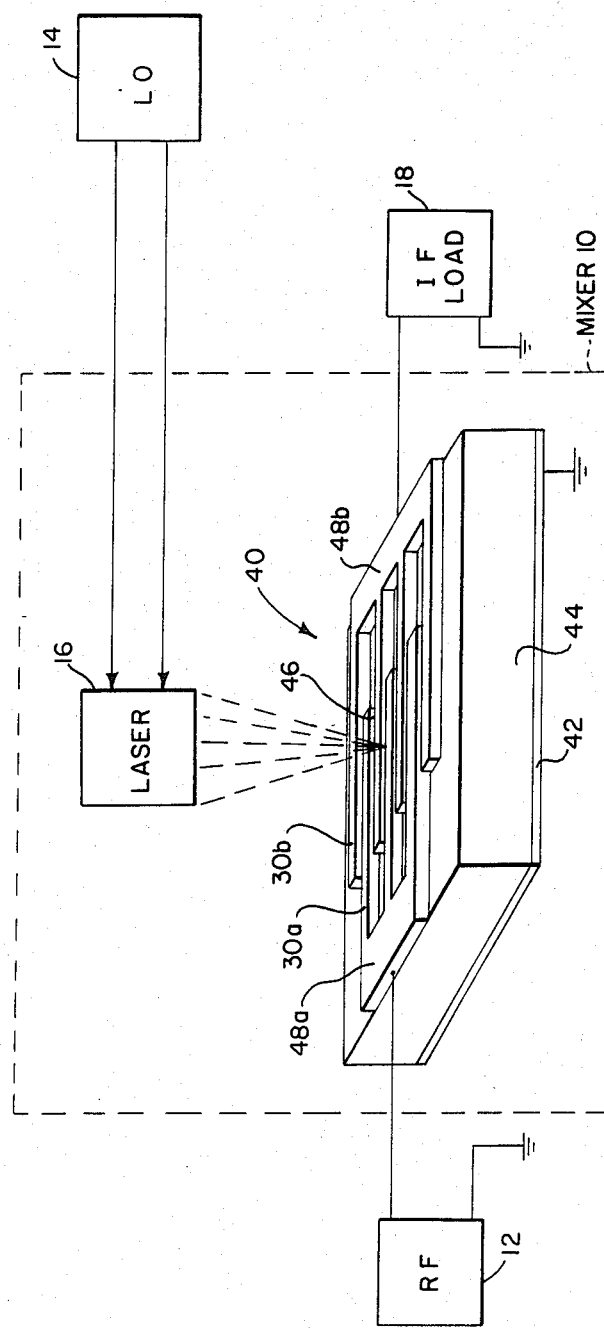
FIG. 1 is a schematic representation of an optoelectronic mixer in accordance with the invention.

FIG. 1 shows the operation of an indium phosphide optoelectronic switch 40 in a mixer circuit 10. Note that this circuit is shown in schematic form only and no attempt has been made to show the device in packaged form. Those skilled in the art will realize that the laser and mixer must be optically coupled together and packaged to reduce noise from extraneous photon sources. An input signal such as a radio frequency signal from a signal source 12 is coupled to an upper planar conducting surface electrode 48 which is fabricated on an indium phosphide semi-insulating substrate 44. A lower electrode 42 may be used to form a ground plane if necessary. Upper planar conducting surface 48 is comprised of two interdigitated finger electrodes 48a and 48b with an interdigitated tortuous path forming a gap 46 between the electrodes. The width of this gap is about 2 μm wide.

Normally, the electrical signal from RF signal source 12 will not be coupled through switch 40 because of the break in the signal path caused by the gap. Thus, the normal state of the switch 40 is "open" or "off". However, when light energy from laser 16 is caused to illuminate the gap, photons are absorbed near the surface of the semi-insultating substrate 44 and a photogenerated electron-hole plasma forms a conducting path across the gap 46 closing the switch in the "on" position.

Thus, in operation, the RF signal from RF source 12, which may, for example, be an AM or FM signal, may be coupled to the IF load 18 in accordance with the state of illumination of gap 46; which is controlled by laser source 16. Therefore, as the laser source is turned "on" or "off" by a local oscillator signal from LO source 14, the output of switch 40 will be an IF signal containing sums and difference components of the LO and RF signal. A filter (not shown) may be used to filter out undesirable products of the mixer and pass the desired difference or IF signal to an IF load where it may be demodulated, amplified and utilized.

For operation of the mixer in the bilinear mode, as mentioned earlier, the laser is D.C. biased to the middle of its linear range of operation, i.e., to the range about which the intensity of its light output varies linearly. Also, the laser is linearly A.C. modulated by the LO signal, forming a linear mixer in which the LO and RF signals are mixed in a linear fashion thereby minimizing non-linear harmonics and retaining all the information available in the signals.

Referring now to FIG. 2, the process steps for fabricating an optoelectronic switch suitable for use as a mixer/chopper modulator will be described in detail. First, a polished semi-insulating indium phosphide sample 20 (FIG. 2a) is cleaned using standard solvents and then etched in a suitable etching solution for 3 minutes to remove 10 μm of material in order to remove any residual polishing damage. A suitable etchant solution is an etchant comprised of one part HCl, 6 parts $HNO_3$, 1 part $HClO_4$ and 1 part $CH_3COOH$. The etched indium phosphide sample 20 is made semi-insulating by diffusion or introduction of a suitable dopant such as iron or chromium acceptor impurities during the growth of the ingot.

Figure 2A:
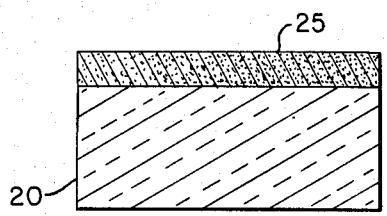
FIGS. 2(a)-(e) is a series of section views showing the fabrication of an optoelectronic switch of the invention in the various process stages (Note.
Figure 2B:
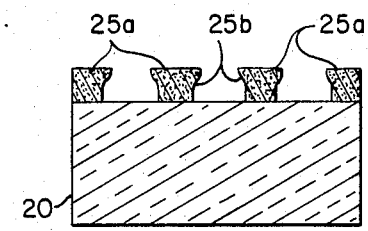
Figure 2C:
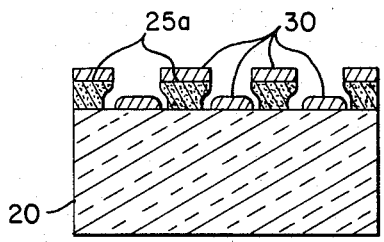
Figure 2D:
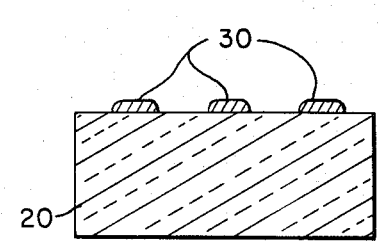
Figure 2E:
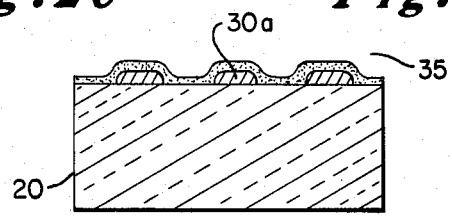

Next, the etched InP samples are coated with a photoresist 25 such as Shipley AZ1450J. Conformable-mask lithography is then used to pattern the samples, and a brief chlorobenzene soak is used to provide a slight lip 25b on the photoresist. The resulting photoresist pattern is shown as film 25a in FIG. 2b. A metal (film 30) is then evaporated onto the samples, such as, by an electron-beam oil-diffusion-pump system. An evaporation sequence on Ni (400Å) then Ge (300Å), and finally Au (3400 Å) may be used as shown in FIG. 2c. The samples are then removed from the evaporator, and the excess metal and photoresist removed using a lift-off process (See FIG. 2d). The top surface of each sample is next covered with a 2000-Å layer of pyrolytic phosphosilicate glass (PSG) 35 (FIG. 2e) deposited at 250° C. to protect the surface while the sample is heated to 450° C. for ten seconds to alloy the contacts 30a. The PSG layer 35 is then removed, and the samples are ready for subsequent use and evaluation.

We have found that alloying the contacts as described above results in a significant improvement in sensitivity of these devices to laser light. The result is believed to be caused by a substantial reduction in device resistance in the illuminated state. While not all layers have been found to show this improvement after alloying, this particular combination of Ni, Ge and Au is believed to be successful by virtue of the inclusion of an N-type dopant, i.e., Ge.

Figure 3:
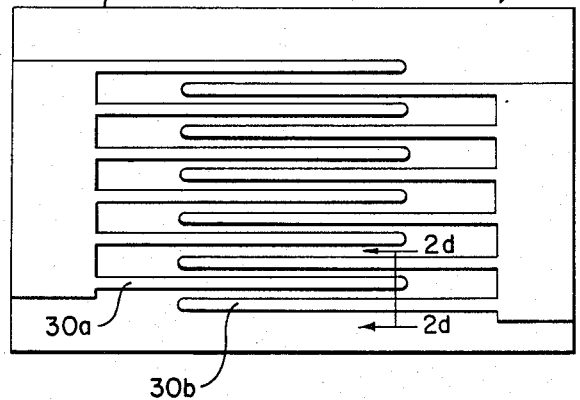
FIG. 3 is a top view of an optoelectronic switch.

A top view of one such sample 20 is shown in FIG. 3. The interdigitated-electrode structure is shown generally at 30. Each electrode 30a and 30b has six fingers 2 μm wide with 2 μm spacing between fingers.

We have additionally found that the response time of optoelectronic switches may be greatly reduced by subjecting the switch to proton bombardment. Accordingly, after the PSG is removed, the wafers are bombarded with a $10^{13}/cm^2$ dose of 200-keV protons and then annealed again in a hydrogen atmosphere.

The response time of switches made as indicated above using different annealing temperatures is tabulated in Table 2 below:

TABLE 2

| Treatment | Fall Time** | Electron Mobility |
|---|---|---|
| No bombardment | ~5 nsec | ~2000 cm$^2$/Vsec |
| (No Annealing) 200 KeV | <100 psec | 200 cm$^2$/Vsec |
| Annealing at 250° C. 200 KeV | <100 psec | 1000 cm$^2$/Vsec |
| Annealing at 300° C. 200 KeV | <100 psec | 1000 cm$^2$/Vsec* |

*A small "back porch" occurs on the trailing edge.
**In all cases, the rise time is ~100 psec, limited by the laser rise time.

In another experiment, samples were made as indicated above, except that the proton energy bombardment level was varied; such that, a schedule of $10^{13}/cm^3$ protons at each of three energies, 100 keV, 200 keV and 300 keV were used to provide more nearly uniform depth distribution of bombardment effects. The results were similar to those shown in Table 2, except that the "back porch" effect was substantially reduced. These results suggest that proton energies in the range 10–1000 keV would be useful to improve device performance. In addition, other proton doses could be employed.

While the devices described herein consist of indium phosphide substrates with top interdigital finger electrode structures and bonding pads, it is contemplated that other semiconductor substrates and also transmission line configurations will benefit from this invention as well. For example, both the high and ground conductive layers may lie in the top of the substrate parallel to each other such that the substrate is intermediate between the two co-planar parallel conductive strips, one of which has a non-conductive gap. Such structures would also allow one to easily perform shunt modulation, where the laser-generated plasma would form a conducting path between the electrodes. Other suitable semiconductor materials, such as GaAs, GaAs/Al-GaAs, or Si, may be used in place of InP. The laser may be any of the well known sources of photons. Preferably, a semiconductor laser is employed and we have found that a mixer as described herein because of its increased sensitivity works very well even with the low power from a semiconductor laser source.

Those skilled in the art may recognize other equivalents to the specific embodiments described herein, which equivalents are intended to be encompassed by the claims attached hereto. For example, the simple geometry shown in the embodiments may be modified to provide various other configurations, such as interlaced spiral structures of a strip line form.

Furthermore, the mixer may be employed in many applications other than radio communication. For example, television, radar, and sonar are within the contemplated uses of the mixer/modulator described herein. Also, the mixer may, by extension, be employed in well known double-balanced and other mixer configurations. Those skilled in the art will recognize many other equivalents to the specific embodiments described herein. The following claims are therefore intended to cover such equivalents.

We claim:
1. An optoelectronic mixer comprising:
  (a) a substrate with planar conducting electrodes on a surface thereof;
  (b) one of said planar conducting electrode structures having a non-conducting space providing a non-conductive gap on said surface and adapted to be illuminated by photons from a photon source which generates a photon beam controlled by a first source of oscillatory electrical signals whereby a photo-generated plasma forms a conducting path across the gap in accordance with such oscillatory signals thereby periodically completing an electrical circuit between:
    (i) a second source of oscillatory electrical signals adapted to be coupled to one side of said electrode and
    (ii) a utilization device adapted to be coupled to another of said conducting electrodes;
  (c) the product of said first and second oscillatory signals being thereby coupled to said load;
  (d) and wherein the photon source is a laser which is biased so that the intensity of the photon beam produced by the laser varies in a linear fashion throughout its operating range such that the mixer is operated in the bilinear mode such that the first and second signals are mixed in a linear fashion.

2. The apparatus of claim 1 wherein the substrate is indium phosphide.

3. The apparatus of claim 1 wherein the substrate is subjected to proton bombardment at an energy level in the range of 10–1000 keV to enhance photon response time.

* * * * *